United States Patent
Amano

(12) 
(10) Patent No.: US 6,392,350 B1
(45) Date of Patent: May 21, 2002

(54) PLASMA PROCESSING METHOD

(75) Inventor: Hideaki Amano, Zama (JP)

(73) Assignee: Tokyo Electron Limited, Tokyo-To (JP)

( * ) Notice: Subject to any disclaimer, the term of this patent is extended or adjusted under 35 U.S.C. 154(b) by 26 days.

(21) Appl. No.: 09/656,214

(22) Filed: Sep. 6, 2000

Related U.S. Application Data

(63) Continuation of application No. PCT/JP99/03443, filed on Jun. 28, 1999.

(30) Foreign Application Priority Data

Jun. 30, 1998 (JP) .......................................... 10-201287

(51) Int. Cl.$^7$ ................................................. H05H 1/16
(52) U.S. Cl. ............................ 315/111.21; 315/111.41; 204/298.16; 204/298.37
(58) Field of Search ....................... 315/111.21, 111.41, 315/111.71; 204/298.16, 298.37

(56) References Cited

U.S. PATENT DOCUMENTS 5,198,725 A * 3/1993 Chen et al. ............. 315/111.41

FOREIGN PATENT DOCUMENTS

JP 4-131379 5/1992

* cited by examiner

*Primary Examiner*—David Vu
(74) *Attorney, Agent, or Firm*—Finnegan, Henderson, Farabow, Garrett & Dunner LLP

(57) ABSTRACT

There is provided a method capable of shortening a preheat time when a thin film is deposited after a preheat is carried out. The current values of a main electromagnetic coil and an auxiliary electromagnetic coil during a preheat and during a thin-film deposition are set to be different from each other to change the shape of an obtained magnetic field so that the magnetic field has a small magnetic flux density although it has higher uniformity during the thin-film deposition, whereas the magnetic field has a large magnetic flux density although it has lower uniformity during the preheat. As a result, a substantially uniform plasma is produced in the plane of a wafer during the thin-film deposition, so that it is possible to carry out a uniform thin-film deposition. On the other hand, during the preheat, a plasma having a larger density than that during the thin-film deposition is produced although the uniformity thereof is lower. Therefore, the heat gain into the wafer is greater than that during the thin-film deposition, so that it is possible to shorten the preheat time.

9 Claims, 10 Drawing Sheets

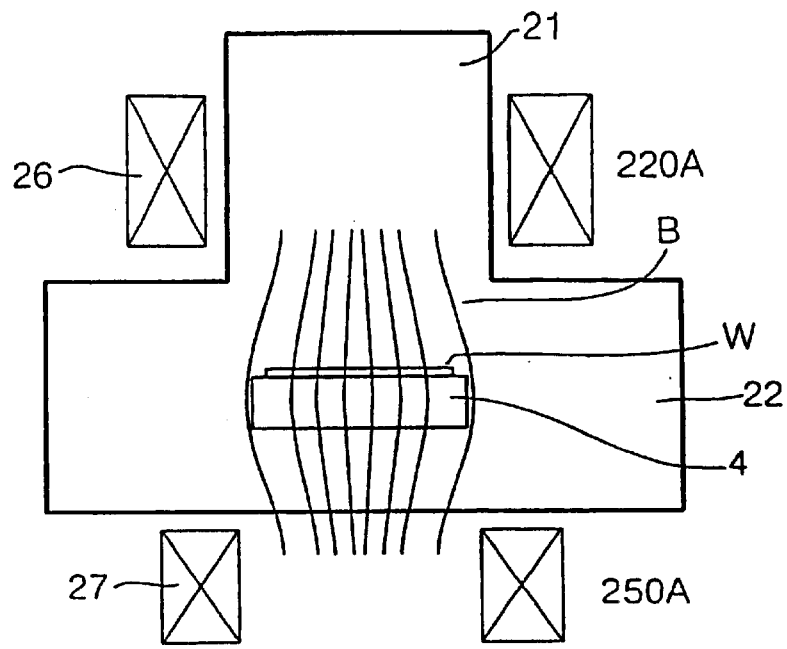
F I G. 2 (a)
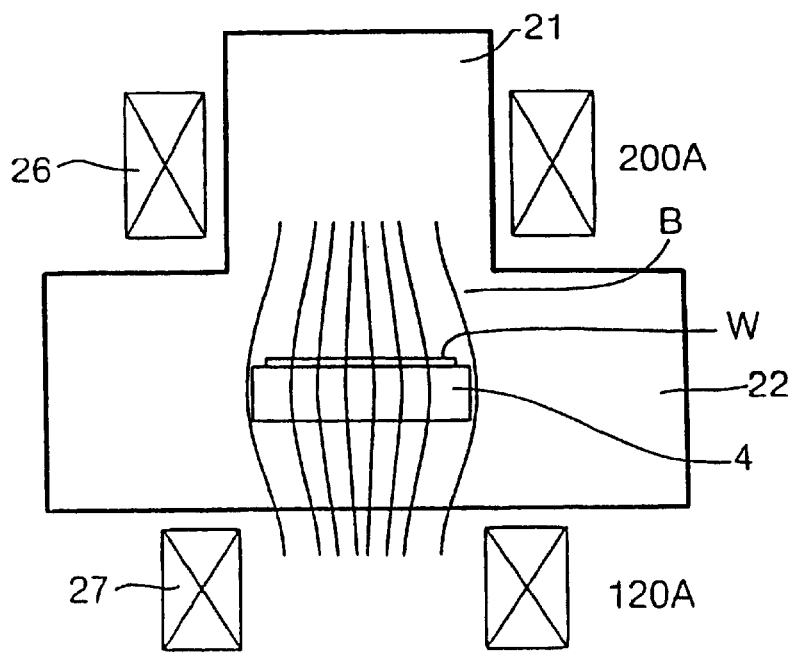
F I G. 2 (b)

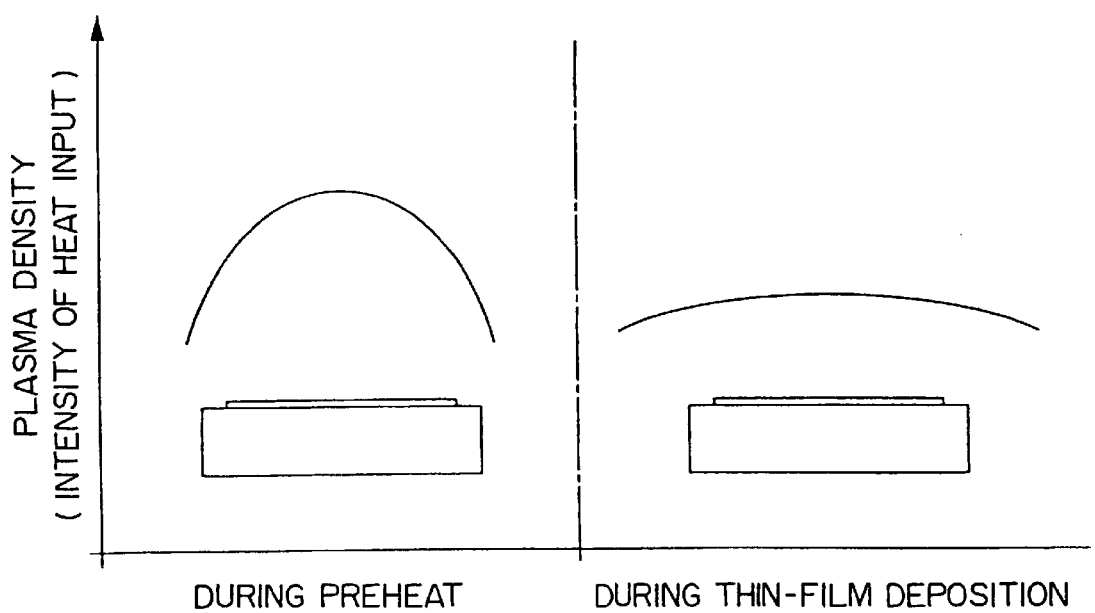
F I G. 3

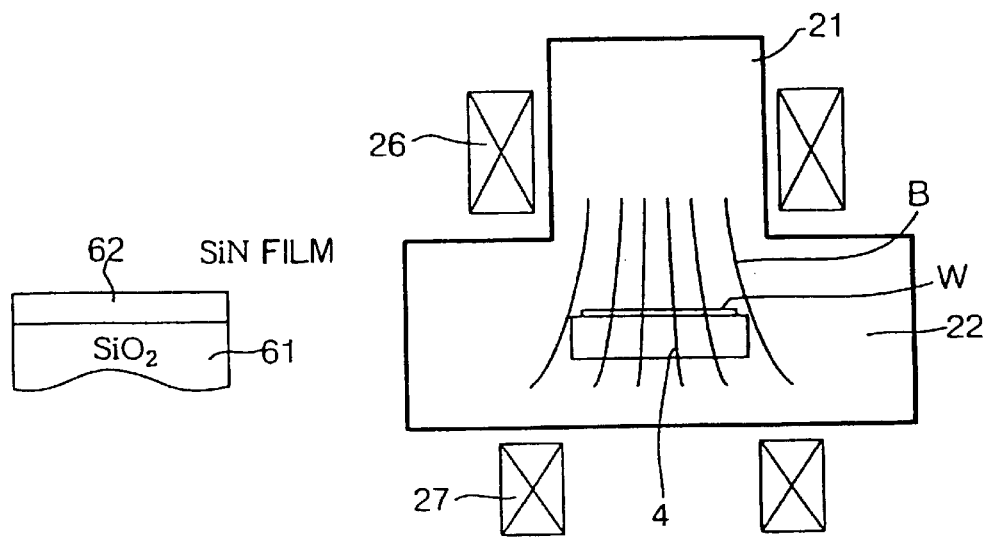
F I G. 4 (a)
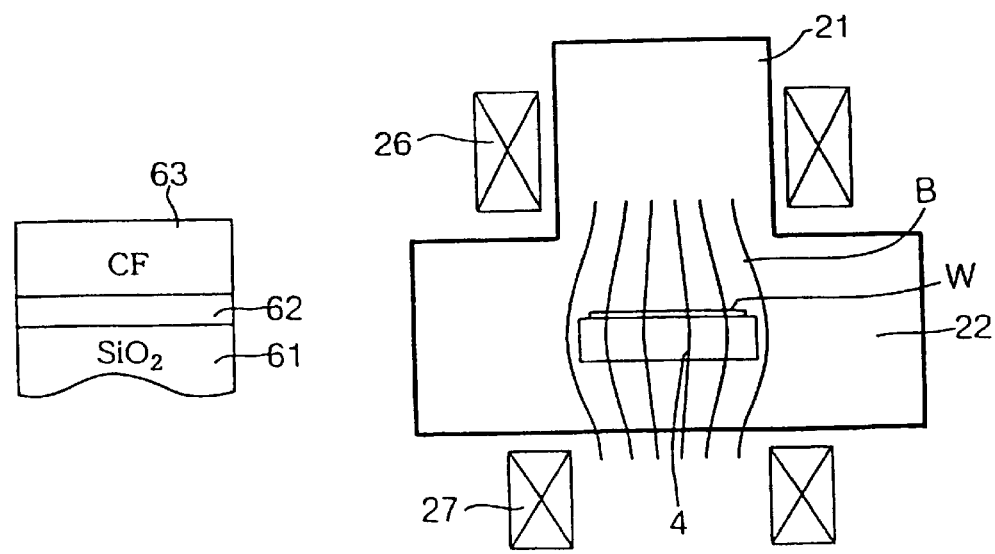
F I G. 4 (b)

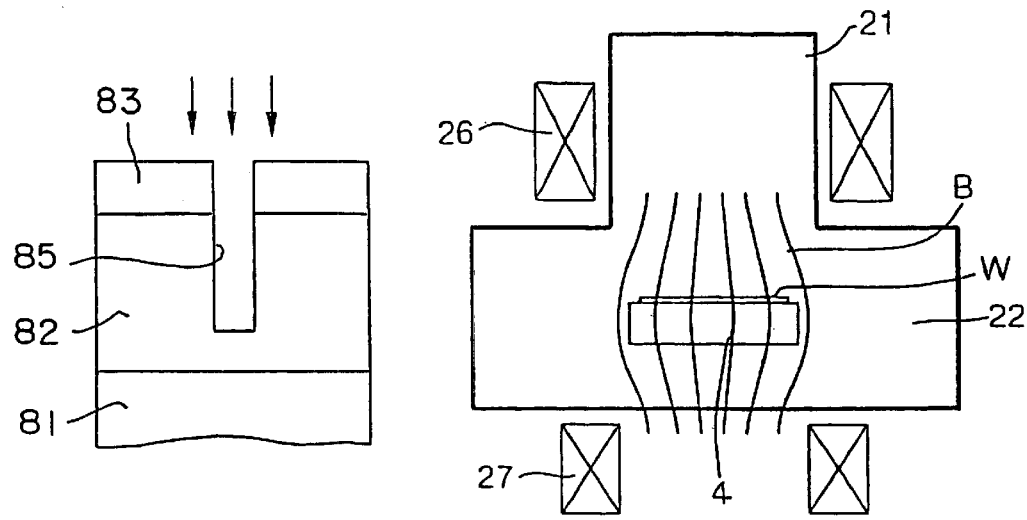
F I G. 7(a)
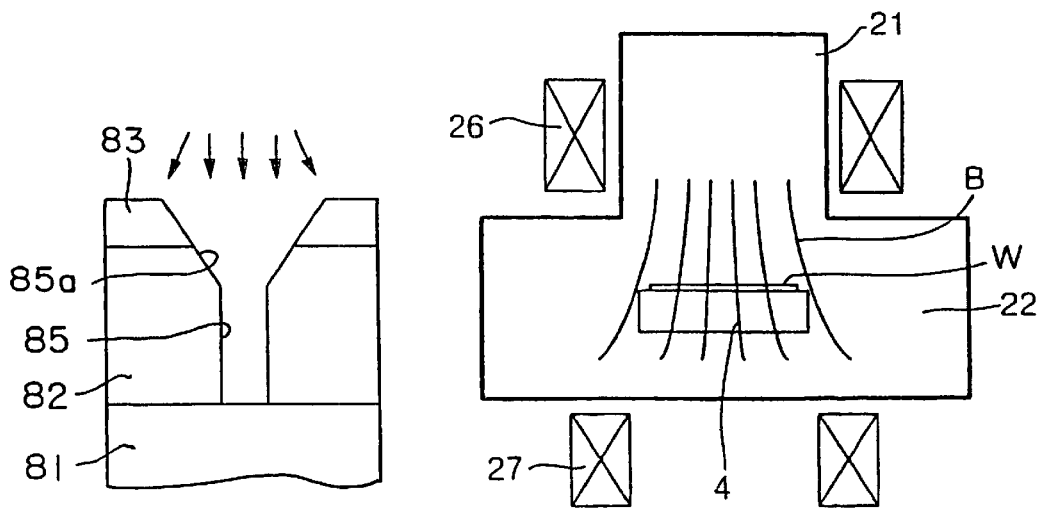
F I G. 7(b)

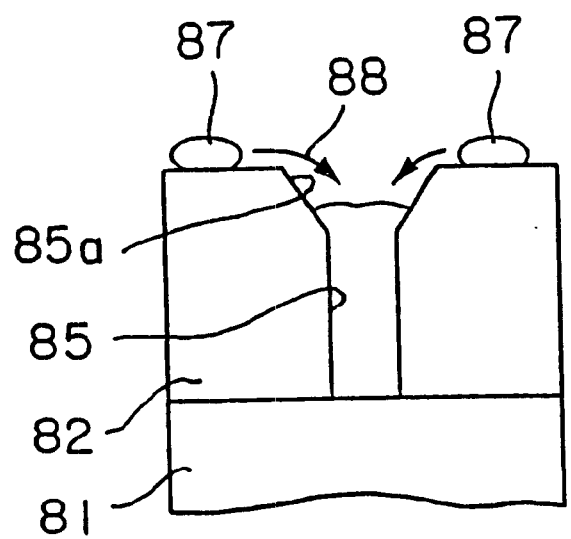
F I G. 8
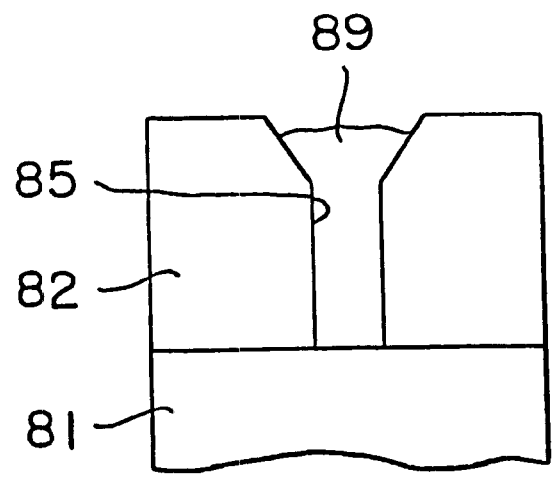
F I G. 9

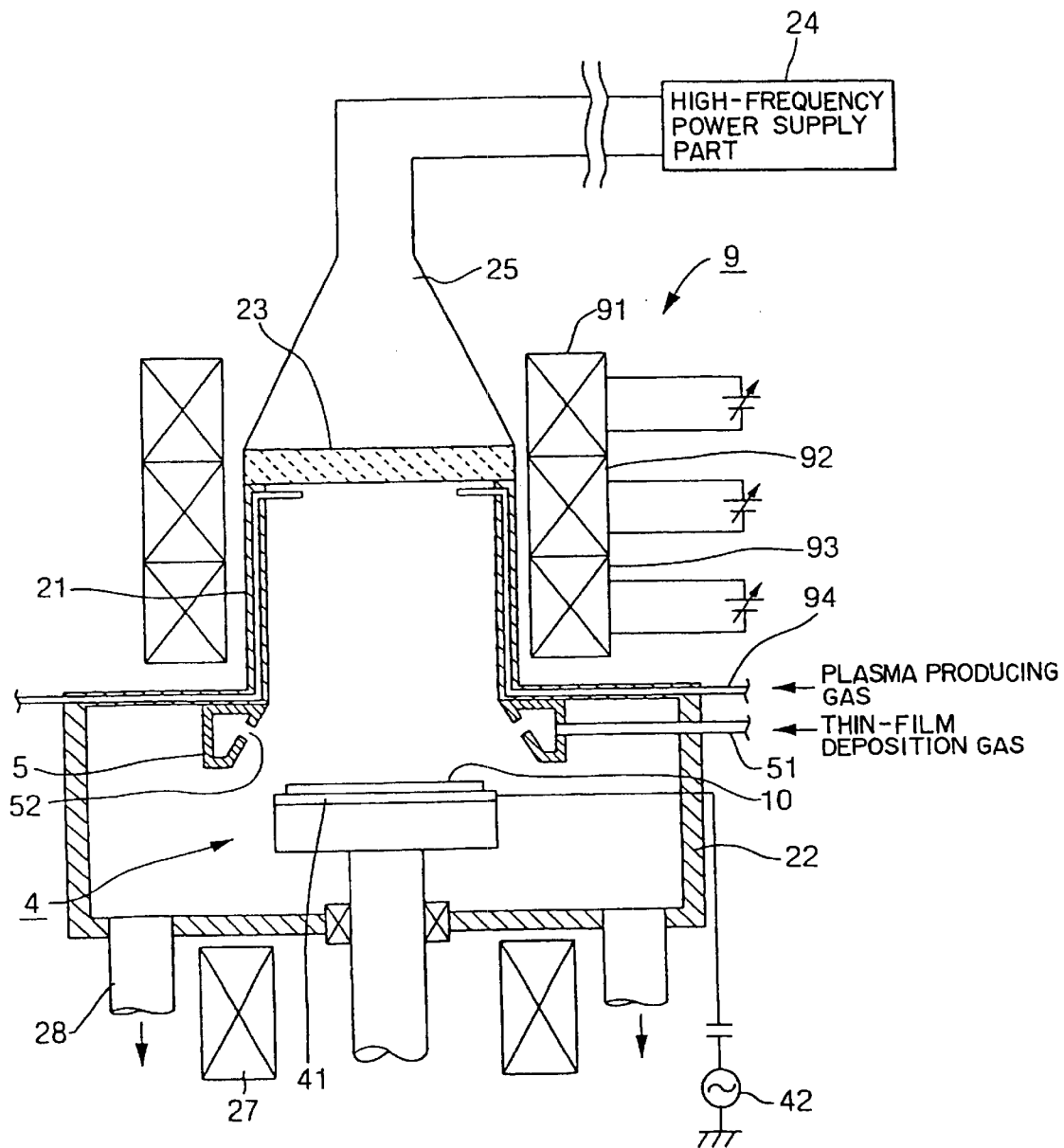
F I G. 10

PLASMA PROCESSING METHOD

This application is a Continuation of International Application No. PCT/JP99/03443, filed Jun. 28, 1999.

TECHNICAL FIELD

The present invention relates generally to a plasma processing method for carrying out a plasma processing, such as an electron cyclotron resonance (ECR) treatment, with respect to a substrate to be treated, such as a semiconductor wafer, to form and etch a thin film, such as an $SiO_2$ film or a fluorine containing carbon film.

BACKGROUND ART

In order to achieve the high density integration of semiconductor devices, it has been developed to provide devices with scale down of patterns and multilayering of circuits. As one of such devices, there is a technique for multilayering wiring. In order to provide a multilayer metallization structure, a number n wiring layer and a number (n+1) wiring layer are connected to each other by means of a conductive layer, and a thin-film called an interlayer dielectric film is formed in a region other than the conductive layer. Typical interlayer dielectric films are $SiO_2$ and SiOF films. These films are formed by means of a plasma processing system for carrying out the ECR plasma processing, which is shown in, e.g., FIG. 11.

For example, in this system, a microwave of, e.g., 2.45 GHz, is supplied into a plasma producing chamber 1A via a waveguide 11, and a magnetic field of, e.g., 875 gausses, is applied thereto. The interaction (the electron cyclotron resonance) between the magnetic field and the microwave activates a plasma gas, such as Ar gas or $O_2$ gas, and a thin-film deposition gas, such as $SiH_4$ gas, which is introduced into a thin-film deposition chamber 1B as plasmas to form a thin film on a semiconductor wafer W which is mounted on a mounting table 12.

By combining a main electromagnetic coil 13, which is provided so as to surround the plasma chamber 1A, with an auxiliary electromagnetic coil 14, which is provided on the bottom side of the thin-film deposition chamber 1B, the magnetic field extends downward to be applied from the plasma chamber 1A to the thin-film deposition chamber 1B. In addition, in order to improve the uniformity of the quality of the film, the positions and current values of the main electromagnetic coil 13 and the auxiliary electromagnetic coil 14 are adjusted so that the magnetic flux density on the surface of the wafer W is substantially uniform, thereby producing uniform plasma.

In actual process, a treatment called a preheat is generally carried out after the wafer W is mounted on the mounting table 12. If the thin-film deposition treatment is carried out by introducing the thin-film deposition gas immediately after a wafer W of ordinary temperature is mounted on the mounting table 12, the temperature of the wafer W does not rise to a predetermined temperature, which is set during the thin-film deposition, although the wafer W is heated by plasma. Thus, the thin-film deposition proceeds at a lower temperature than an intended temperature, so that a thin film having a bad quality is formed. In order to prevent this, the preheat treatment is carried out.

Specifically, before the thin-film deposition gas is introduced after the wafer W is mounted on the mounting table 12, a plasma is produced to heat the wafer W to a predetermined temperature, e.g., a thin-film deposition temperature, and then, the thin-film deposition gas is introduced to carry out the thin-film deposition treatment. At this time, the preheat and the thin-film deposition treatments are carried out by producing plasma, which has been considered to be optimum in the thin-film deposition, without changing any parameters of the microwave and magnetic field.

However, in the above described method, a uniform plasma is produced in the vicinity of the wafer W so as to be suited to the thin-film deposition, so that the magnetic flux density is expanded. Therefore, the total heat gain is small although the heat gain per unit area is uniform. Therefore, it takes a lot of time from the point of view of the preheat. For example, even if a plasma is produced immediately after the wafer W is mounted, it takes about 60 seconds to raise the temperature of the wafer W from 80° C. to 400° C., which is the thin-film deposition temperature, so that there is a problem in that the total throughput deteriorates.

DISCLOSURE OF THE INVENTION

It is therefore a principal object of the present invention to eliminate the aforementioned problems and to provide a plasma processing method capable of shortening a preheat time.

It is another object of the present invention to provide a plasma processing method capable of improving the uniformity of the quality of each of various kinds of thin films when the thin films are deposited.

It is a further object of the present invention to provide a plasma processing method capable of shortening the time required to carry out a post treatment, such as the removal of an etching gas and a resist film after etching.

It is a still further object of the present invention to provide a plasma processing method capable of shortening the time required to carry out a pretreatment, such as the removal of a natural oxide film which is formed on the surface of a substrate.

Therefore, the present invention is characterized by a plasma processing method for supplying a microwave into a vacuum vessel by high-frequency producing means and for forming a magnetic field in the vacuum vessel by magnetic field forming means to produce a plasma in the vacuum vessel by the electron cyclotron resonance between the microwave and the magnetic field to treat a substrate to be treated with the produced plasma, the method comprising: a first step of introducing the substrate into the vacuum vessel and for producing a plasma to heat the substrate; and a second step of activating a thin-film deposition gas in the vacuum vessel as a plasma which forms a thin film on the substrate, wherein the shape of the magnetic field is changed by setting the current values of the magnetic field forming means at the first and second steps to be different from each other so that the magnetic flux density on the substrate during the production of the plasma at the first step is greater than that at the second step.

In addition, the present invention is characterized by a first thin-film deposition step of activating a first thin-film deposition gas in the vacuum vessel as a plasma which forms a first film on the substrate, and a second thin-film deposition step of activating a second thin-film deposition gas in the vacuum vessel as a plasma which forms a second film on the first film, wherein the current values of the magnetic field forming means at the first and second thin-film deposition steps are set to be different from each other to change the shape of a magnetic field.

Moreover, the present invention is characterized by an etching step of activating an etching gas in the vacuum vessel as a plasma which etches the substrate, and a post-treatment step of activating a post-treating gas in the vacuum vessel as a plasma which carries out a post-treatment, wherein the shape of the magnetic field is changed by setting the current values of the magnetic field forming means at the etching and post-treatment steps to be different from each other so that the magnetic flux density on the substrate during the production of the plasma at the post-treatment step is greater than that at the etching step. The post-treatments herein include a treatment for removing the residual of an etching gas and a treatment for ashing a resist film with oxygen gas.

In addition, the present invention may be characterized by an etching step of activating an etching gas in the vacuum vessel as a plasma which etches a natural oxide film on the surface of the substrate, and a thin-film deposition step of activating a thin-film deposition gas in the vacuum vessel as a plasma which forms a thin film on the surface of the substrate, wherein the shape of the magnetic field is changed by setting the current values of the magnetic field forming means at the etching and thin-film deposition steps to be different from each other so that the magnetic flux density on the substrate during the production of the plasma at the etching step is greater than that at the thin-film deposition step.

Moreover, the present invention may be characterized by a first etching step of activating an etching gas in a vacuum vessel as a plasma which etches the substrate, and a second etching step of further etching the substrate by the plasma after the first etching step, wherein the shape of the magnetic field is changed by setting the current values of the magnetic field forming means at the first and second etching steps to be different from each other so that the isotropy of etching with respect to the surface of the substrate at the second etching step is higher than that at the first etching step. The shape of the magnetic field at the first etching step may be the shape of a mirror magnetic field, and the shape of the magnetic field at the second etching step may be the shape of a divergent magnetic field.

BRIEF DESCRIPTION OF THE DRAWINGS

FIGS. 2(a)–2(b) are a sectional view for explaining the relationship between the current values of a main electromagnetic coil and an auxiliary electromagnetic coil and the shape of a magnetic field;

FIG. 3 is an illustration for explaining the intensity of heat input;

FIGS. 4(a)–4(b) are a sectional view for explaining another embodiment of the present invention;

FIGS. 7(a)–7(b) are a sectional view for explaining a still further embodiment of the present invention;

FIG. 8 is a sectional view for explaining the embodiment shown in FIG. 7;

FIG. 9 is a sectional view for explaining the embodiment shown in FIG. 7;

FIG. 10 is a longitudinal sectional view showing another example of a plasma processing system for carrying out the present invention.

BEST MODE FOR CARRYING OUT THE INVENTION

Figure 1:
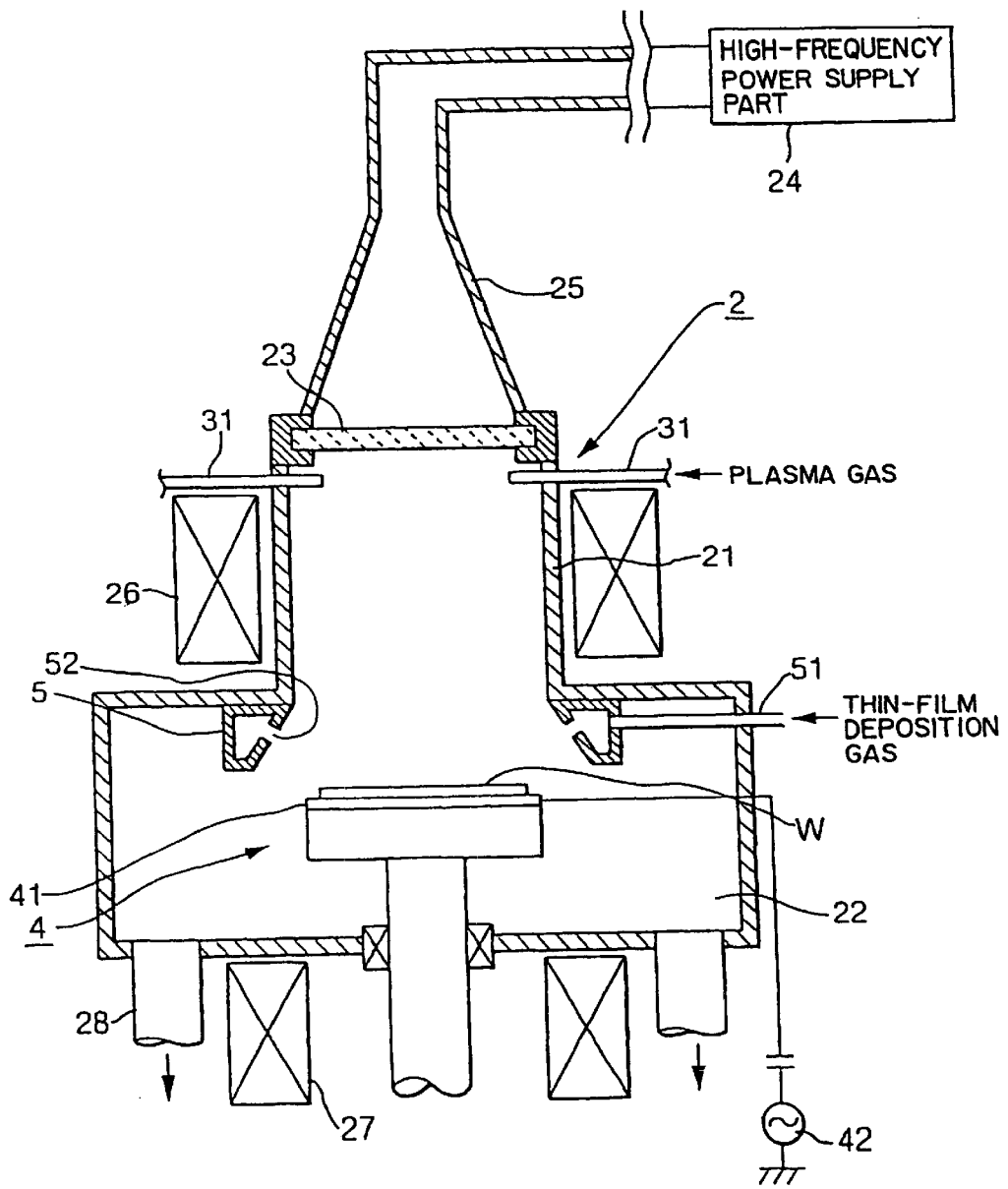
FIG. 1 is a longitudinal sectional view showing an example of a plasma processing system for carrying out the present invention.

First, an example of a plasma processing system for use in a preferred embodiment of the present invention is shown in FIG. 1. This system has a vacuum vessel 2 formed of, e.g., aluminum. The vacuum vessel 2 comprises a first cylindrical vacuum chamber 21, which is arranged in an upper portion for producing a plasma, and a second cylindrical vacuum chamber 22, which is communicated with and connected to the lower portion of the first vacuum chamber 21 and which has a greater diameter than that of the first vacuum chamber 21. Furthermore, the vacuum vessel 2 is grounded to have a zero potential.

The upper end of the vacuum vessel 2 is open. A transmission window 23 of a microwave permeable material, e.g., quartz, is airtightly provided in the open upper end of the vacuum vessel 2 so as to maintain vacuum in the vacuum vessel 2. Outside of the transmission window 23, there is provided a waveguide 25 which is connected to a high-frequency power supply part 24 serving as a high-frequency producing means for producing a microwave of, e.g., 2.45 GHz. The microwave produced by the high-frequency power supply part 24 is guided by the waveguide 25 in, e.g., a TE mode, or the microwave guided in the TE mode is converted by the waveguide 25 into a TM mode, to be introduced from the transmission window 23 into the first vacuum chamber 21.

In the side wall defining the first vacuum chamber 21, gas nozzles 31 are arranged at regular intervals along, e.g., the periphery thereof. The gas nozzles 31 are connected to, e.g., a plasma producing gas source (not shown), so that a plasma producing gas, e.g., Ar gas or $O_2$ gas, can be uniformly supplied to the upper portion of first vacuum chamber 21.

In the second vacuum chamber 22, a mounting table 4 for a semiconductor wafer (which will be hereinafter referred to as a "wafer") W, which is a substrate to be treated, is provided so as to face the first vacuum chamber 21. The mounting table 4 has an electrostatic chuck 41 on the surface thereof. The electrode (not shown) of the electrostatic chuck 41 is connected to a dc power supply (not shown) for absorbing the wafer W and to a high-frequency power supply part 42 for applying a bias voltage for implanting ions into the wafer W.

In the upper portion of the second vacuum chamber 22, i.e., in a portion of the second vacuum chamber 22 that communicates with the first vacuum chamber 21, a ring-shaped thin-film deposition gas supply part 5 is provided. The thin-film deposition gas supply part 5 is designed to supply a thin-film deposition gas, such as $SiH_4$ gas, from a gas supply pipe 51 into the vacuum vessel 2 via gas holes 52 which are formed in the inner peripheral face of the thin-film deposition gas supply part 5.

In the vicinity of the outer periphery of the side wall defining the first vacuum chamber 21, a main electromagnetic coil 26 having, e.g., a ring shape, is arranged. Below the second vacuum chamber 22, an auxiliary electromagnetic coil 27 having, e.g., a ring shape, is arranged. In addition, exhaust pipes 28 are connected to the bottom portion of the second vacuum chamber 22 at, e.g., two places which are symmetrical with respect to a central axis of the vacuum chamber 22. In this embodiment, the main electromagnetic coil 26 and the auxiliary electromagnetic coil 27 constitute a magnetic field forming means.

Referring to FIGS. 1, 2(a) and 2(b), a series of processes for forming an interlayer dielectric film of an $SiO_2$ film on a wafer W by means of the above described system will be described below. First, a gate value (not shown) provided in the side wall of the vacuum vessel 2 is open, and the wafer W, on which a wiring of, e.g., aluminum, has been formed, is introduced from a load-lock chamber (not shown) by means of a transfer arm (not shown) to be mounted on the mounting table 4 to be electrostatically absorbed by means of the electrostatic chuck 41, so that a preheat (a first step) is carried out as shown in FIG. 2(a).

That is, after the gate value is closed to seal the interior of the vacuum vessel 2, the internal atmosphere is exhausted by the exhaust pipes 28, and the interior of the vacuum vessel 2 is evacuated to a predetermined degree of vacuum to be maintained at a predetermined process pressure. In this state, Ar gas is introduced from the gas nozzles 31 into the first vacuum chamber 21 at a predetermined flow rate. Then, a high-frequency wave (a microwave) of 2.45 GHz and 2.8 kW is supplied from the high-frequency power supply part 24, and a bias voltage of 13.56 MHz and 0 kW is applied to the mounting table 4 from the high-frequency power supply part 24. Furthermore, the surface temperature of the mounting table 4 is set to always be a certain temperature, e.g., 80° C. The bias voltage is set to be 0 kW in order to reduce damage to the device under an uniform specification. However, during the thin-film deposition on a device to which small damage may be caused, a very low bias voltage of about 300 W may be applied to carry out a preheat at a higher speed.

Thus, the microwave from the high-frequency power supply part 24 passes through the waveguide 25 to reach the ceiling of the vacuum vessel 2, and passes through the transmission window 23 to be introduced into the first vacuum chamber 21. In the vacuum vessel 2, a magnetic field extending from the upper portion of the first vacuum chamber 21 to the lower portion of the second vacuum chamber 22 is formed by setting the current values of the main electromagnetic coil 26 and the auxiliary electromagnetic coil 27 to be 220 A and 250 A, respectively, so that the intensity of the magnetic field is, e.g., 875 gausses in the vicinity of the lower portion of the first vacuum chamber 21.

Thus, the interaction between the magnetic field and the microwave induces E (electric field)×H (magnetic field) to cause an electron cyclotron resonance, by which Ar gas is activated as a plasma and enriched. By thus producing the plasma of Ar gas, the plasma is stabilized. The plasma flow thus produced flows from the first vacuum chamber 21 into the second vacuum chamber 22 to heat the wafer W. Thus, until the temperature of the wafer W reaches 400° C., the plasma is produced for about 20 seconds to carry out a preheat.

Subsequently, as shown in FIG. 2(b), the deposition of an $SiO_2$ film (a second step) is carried out. That is, Ar gas and $O_2$ gas are introduced into the first vacuum chamber 21 at predetermined flow rates, and $SiH_4$ gas is introduced from the thin-film deposition gas supply part 5 into the second vacuum chamber 22. Then, the pressure in the vacuum vessel 2 is set at a predetermined process pressure, and a bias voltage of 13.56 MHz and 2.7 kW is applied.

A microwave of 2.45 GHz and 1.8 kW is introduced into the first vacuum chamber 21, and the current values of the main electromagnetic coil 26 and the auxiliary electromagnetic coil 27 are set to be 200 A and 120 A, respectively, so that $SiH_4$ gas is activated (as a plasma) by the electron cyclotron resonance to form active species (plasma). At this time, plasma ions are drawn into the wafer W by the bias voltage to scrape the corners of the pattern (recessed portion) on the surface of the wafer W to expand the opening. In parallel to this sputter etching action, an $SiO_2$ film is deposited to be embedded into the recessed portion. Thus, the interlayer dielectric film of the $SiO_2$ film is formed.

In such an embodiment, the current values of the main electromagnetic coil 26 and the auxiliary electromagnetic coil 27 during the preheat are set to be different from those during the thin-film deposition to change the shape of the magnetic field to produce plasma suitable for each treatment, so that it is possible to reduce the preheat time.

That is, during the preheat, the heat gain into the wafer W is regarded as more important than the uniformity, so that a magnetic field is formed so as to increase the heat gain. On the other hand, during the thin-film deposition, the uniformity is regarded as more important than the heat gain, so that a magnetic field having a high inplane uniformity is formed. As described above, the magnetic field is formed by the main electromagnetic coil 26 and the auxiliary electromagnetic coil 27. The magnetic field formed by the main electromagnetic coil 26 is expanded outward as it goes downward, and the magnetic field formed by the auxiliary electromagnetic coil 27 is expanded outward as it goes upward, so that the outside expanded magnetic field formed by the main electromagnetic coil 26 is narrowed inward by the auxiliary electromagnetic coil 27. In addition, although a plasma is produced by the interaction between the electric field and the magnetic field as described above, the shape of the plasma depends on the shape of the magnetic field.

Therefore, during the thin-film deposition, since the current values of the main electromagnetic coil 26 and the auxiliary electromagnetic coil 27 are set to be, e.g., 200 A and 120 A, respectively, the amount narrowed by the auxiliary electromagnetic coil 27 is small, so that the outside magnetic field is expanded to some extent. Thus, although the lines of magnetic force in the magnetic field B are substantially uniform in the plane of the wafer W as shown in FIG. 2(b), the magnetic flux density thereof is small. Since the density of plasma produced herein (the intensity of heat input into the wafer W) is in proportion to the magnetic flux density, the total heat gain is small although the density of the plasma is substantially uniform in the plane of the wafer W in this case (see FIG. 3).

On the other hand, since the current values of the main electromagnetic coil 26 and the auxiliary electromagnetic coil 27 are set to be 220 A and 250 A, respectively, the amount narrowed by the auxiliary electromagnetic coil 27 is large, so that the lines of magnetic force in the magnetic field B converge in the vicinity of the central portion of the wafer W. In this case, since the magnetic flux density is great in the vicinity of the central portion of the wafer W, the total input gain is far greater than that during the thin-film deposition although the intensity of heat input of the produced plasma is uniform in the plane of the wafer W as shown in FIG. 3.

Thus, in this method, the current values of the main electromagnetic coil 26 and the auxiliary electromagnetic coil 27 are controlled to form a magnetic field so as to increase the input gain into the wafer W during the preheat, and to form a magnetic field having a high inplane uniformity during the thin-film deposition. Therefore, for example, the wafer W of ordinary temperature can be introduced into the vacuum vessel 2 to be mounted and absorbed, and the time (preheat time) required to heat the wafer W, the temperature of which has been raised to about 80° C. at this time, to about 400° C., which is the thin-film deposition temperature, can be about 20 seconds, so that the preheat time can be shortened to be about ⅓ of that in the conventional method.

Referring to FIGS. 4(*a*) and 4(*b*), another embodiment of the present invention will be described below. In this embodiment, the method according to the present invention is applied to a case where some kinds of films are stacked. An example of a structure of films formed in this preferred embodiment is a structure wherein a fluorine containing carbon film 63 (which will be hereinafter referred to as a "CF film") is formed on the top face of a substrate of an $SiO_2$ film and wherein an SiN film 62 is provided between the $SiO_2$ film 61 and the CF film 63 as an adherence layer.

A method for producing a film having such a stacked structure will be described below. For example, in the above described plasma processing system, a first thin-film deposition step of depositing the SiN film 62 serving as the first film on the $SiO_2$ film 61 is carried out. That is, a plasma producing gas, e.g., Ar gas, and first thin-film deposition gases, e.g., silane gas and $N_2$ gas, are introduced at predetermined flow rates, respectively. In addition, under a predetermined process pressure, a bias voltage of 13.56 MHz and a microwave of 2.45 GHz are introduced. Moreover, the current of the main electromagnetic coil 26 is set to be 200 A, and the current of the auxiliary electromagnetic coil 27 is set to be a smaller value (including 0) than that of the main electromagnetic coil 26, e.g., 50 A. Thus, the above described gases are activated as plasmas by the electron cyclotron resonance to form the SiN film 62 having a thickness of about 50 angstroms on the upper surface of the $SiO_2$ film 61.

Then, a second thin-film deposition step of depositing the CF film 63 serving as the second film on the SiN film 62 is carried out. That is, in the above described plasma processing system, Ar gas is used as a plasma producing gas, and $C_4F_8$ gas and $C_2H_4$ gas are used as second thin-film deposition gases. In addition, the current values of the main electromagnetic coil 26 and the auxiliary electromagnetic coil 27 are set to be 200 A and 160 A, respectively. Thus, $C_4F_8$ gas and $C_2H_4$ gas are activated as plasmas by the electron cyclotron resonance to form the CF film 63 having a thickness of about 8000 angstroms on the top face of the SiN film 62.

Thus, in this embodiment, the current values of the main electromagnetic coil 26 and the auxiliary electromagnetic coil 27 during the deposition of the SiN film 62 are set to be different from those during the deposition of the CF film 63 to change the shape of the magnetic field to produce plasma suitable for each treatment, so that it is possible to enhance the inplane uniformity of the quality of each of the films.

That is, when the SiN layer 62 is formed, the current value of the auxiliary electromagnetic coil 27 is set to be far smaller than that of the main electromagnetic coil 26. Therefore, the amount narrowed by the auxiliary electromagnetic coil 27 is very small, so that the magnetic field B is like a divergent magnetic field, which is expanded outward as it goes downward, as shown in FIG. 4(*a*). Since the thin-film deposition rate is small in such a magnetic field, even if the thickness of the SiN layer 62 is 50 angstroms, which is very small, the thin-film deposition amount can be adjusted, so that it is possible to form a thin film having a uniform quality.

On the other hand, when the CF film 63 is deposited, the current value of the auxiliary electromagnetic coil 27 is increased to increase the amount narrowed by the auxiliary electromagnetic coil 27. Therefore, as shown in FIG. 4(*b*), although the magnetic field B is expanded as it goes downward, it is narrowed as it further goes downwards, so that a mirror magnetic field is formed. Although the thin-film deposition rate is high in such a magnetic field, the thickness of the CF film 63 is 8000 angstroms which is greater than that of the SiN film 62. Therefore, even if the thin-film deposition rate is high, the thin-film deposition amount can be adjusted, so that it is possible to form a thin film having a uniform quality at a high rate.

Figure 5A:
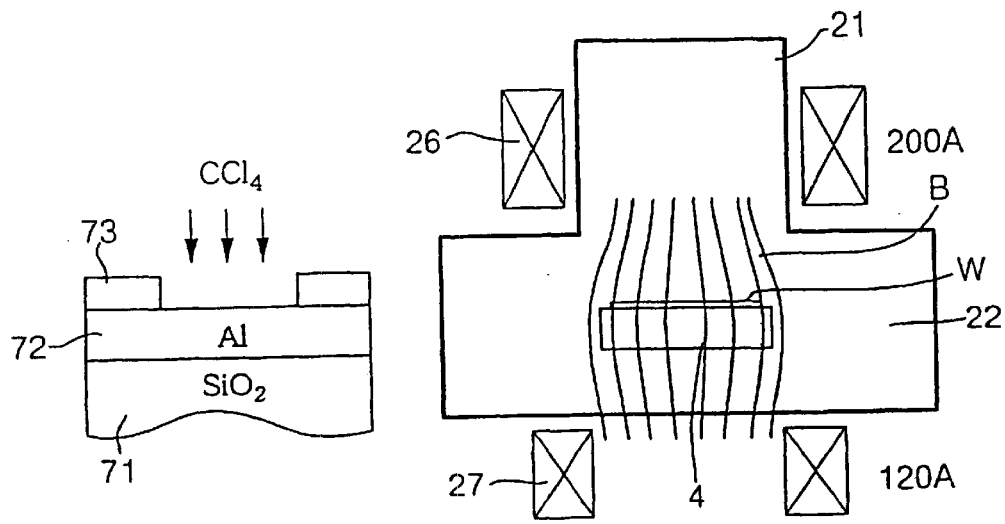
FIGS. 5(a)–5(b) are a sectional view for explaining another embodiment of the present invention.

Referring to FIGS. 5(*a*) and 5(*b*), another embodiment of the present invention will be described below. In this embodiment, the present invention is applied to etching. In an example of etching in this embodiment, an aluminum (Al) layer 72 is formed on the top face of a substrate 71 of, e.g., an $SiO_2$ film, and a pattern of a resist film 73 is formed on the top face of the Al layer 72 to etch the Al layer 72 with an etching gas, e.g., $Cl_2$ gas.

Such etching will be specifically described. First, as shown in FIG. 5(*a*), in the above described plasma processing system, a step of etching the Al layer 72 with $Cl_2$ gas is carried out. That is, plasma producing gases, e.g., Ar gas and $Cl_2$ gas, are introduced at predetermined flow rates, respectively. In addition, under a predetermined process pressure, a bias voltage of 13.56 MHz and a microwave of 2.45 GHz are introduced. Moreover, the current values of the main electromagnetic coil 26 and the auxiliary electromagnetic coil 27 are set to be 200 A and 120 A, respectively. Then, under a process pressure of 0.5 Pa, $Cl_2$ gas is activated as a plasma by the electron cyclotron resonance to etch the Al layer 72 with the plasma. That is, while plasma ions are drawn into the Al layer 72 by the bias voltage to scrape the corners of the pattern (recessed portion) on the surface to expand the opening to carry out the sputter etching.

Thereafter, as shown in FIG. 5(*b*), a post-treatment step of removing a residual $Cl_2$ gas 75, which remains in a groove portion 74 formed by etching, with a post-treating gas is carried out. That is, a plasma producing gas, e.g., Ar gas, and $NH_3$ (ammonia) gas serving as a post-treating gas are introduced at predetermined flow rates, respectively, and the current values of the main electromagnetic coil 26 and the auxiliary electromagnetic coil 27 are set to be 220 A and 250 A, respectively. Then, under a process pressure of 133 Pa, $NH_3$ gas is activated as a plasma by the electron cyclotron resonance to deoxidize, thermally vaporize and remove Cl (chlorine) which is the residual 75.

In such an embodiment, the current values of the main electromagnetic coil 26 and the auxiliary electromagnetic coil 27 during the etching of the Al layer 72 are set to be different from those during the post-treatment to change the shape of the magnetic field to produce plasma suitable for each treatment, so that it is possible to carry out uniform etching and to shorten the time required to carry out the post-treatment.

That is, since the current values of the main electromagnetic coil 26 and the auxiliary electromagnetic coil 27 are set to be 200 A and 120 A, respectively, during the etching, the magnetic field B is a mirror magnetic field wherein the lines of magnetic force are substantially uniform in the plane of the substrate 71 as shown in FIG. 5(*a*) as described above. In such a magnetic field, the density of plasma is substantially uniform in the plane of the substrate 71, so that it is possible to carry out uniform etching.

Figure 5B:
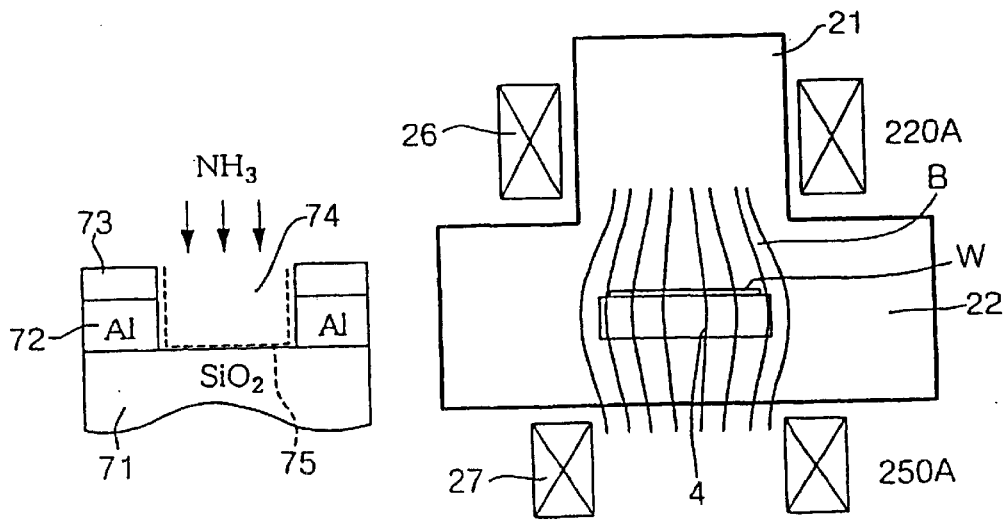

On the other hand, since the current values of the main electromagnetic coil 26 and the auxiliary electromagnetic coil 27 are set to be 220 A and 250 A, respectively, during the post-treatment, the magnetic field B is a mirror magnetic field wherein the lines of magnetic force converge in the vicinity of the central portion of the substrate 71, as shown in FIG. 5(b) as described above. In such a magnetic field, the density of plasma is far greater than that during the etching. However, since the amount of active species increases if the density of plasma increases, the removal of the residual is easy to proceed, so that it is possible to shorten the time required to carry out the post-treatment.

Figure 6A:
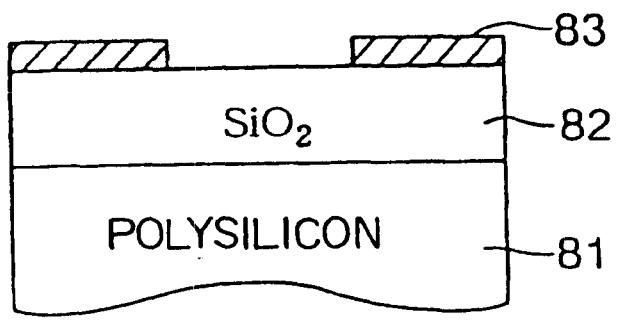
FIGS. 6(a)–6(b) are a sectional view for explaining a further embodiment of the present invention.
Figure 6B:
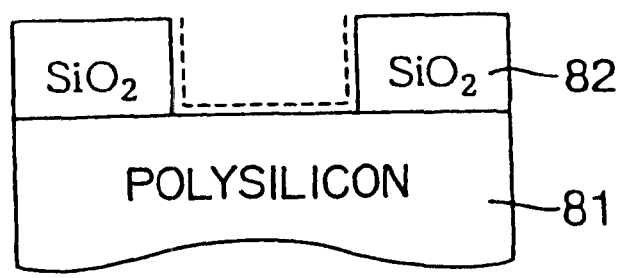
Figure 11:
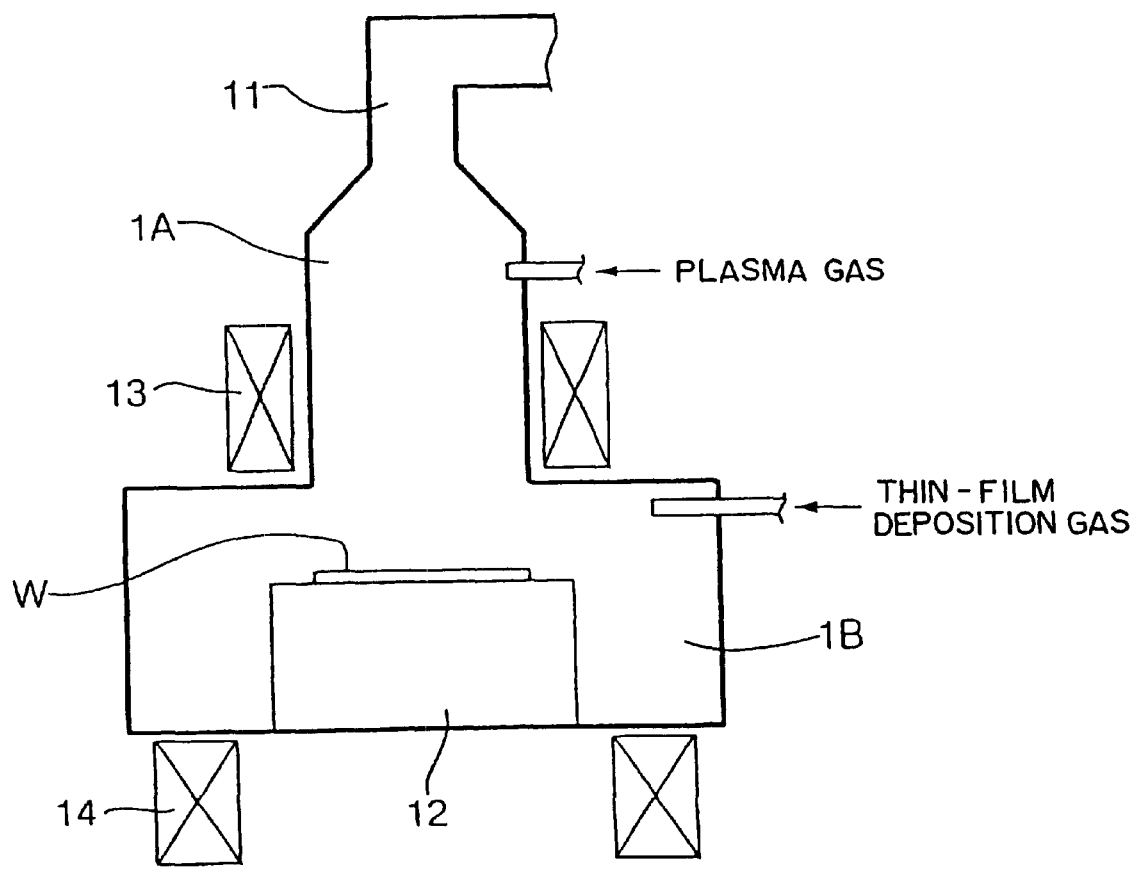
FIG. 11 is a sectional view for explaining a conventional plasma processing system.

Referring to FIGS. 6(a) and 6(b), another embodiment of the present invention, which is applied to etching, will be described below. In this embodiment, an $SiO_2$ film 82 is formed on the top face of a substrate 81 of, e.g., a polysilicon, and a resist film 83 is formed on the top face of the $SiO_2$ film 82 to etch the $SiO_2$ film 82 with an etching gas, e.g., a compound gas of C (carbon) and F (fluorine) (which will be hereinafter referred to as a "CF containing gas"), such as $C_4F_8$ gas.

Such etching will be specifically described. First, as shown in FIG. 6(a), in the above described plasma processing system, a step of etching the $SiO_2$ film 82 with $C_4F_8$ gas is carried out. That is, plasma producing gases, e.g., Ar gas and $C_4F_8$ gas, are introduced at predetermined flow rates, respectively. In addition, under a process pressure of 0.8 Pa, a bias voltage of 13.56 MHz and a microwave of 2.45 GHz are introduced. Moreover, the current values of the main electromagnetic coil 26 and the auxiliary electromagnetic coil 27 are set to be 200 A and 120 A, respectively. Then, $C_4F_8$ gas is activated as a plasma by the electron cyclotron resonance to etch the $SiO_2$ film 82 with the plasma.

Thereafter, as shown in FIG. 6(b), a post-treatment step of ashing the resist film 82 with $O_2$ gas is carried out. That is, a plasma producing gas, e.g., Ar gas, and $O_2$ gas serving as a post-treating gas are introduced at predetermined flow rates, respectively, and the current values of the main electromagnetic coil 26 and the auxiliary electromagnetic coil 27 are set to be 220 A and 250 A, respectively. Then, under a process pressure of 1.5 Pa, $O_2$ gas is activated as a plasma by the electron cyclotron resonance to decompose the resist film 83 with the plasma into $H_2O$ and $CO_2$ which are removed.

In such an embodiment, the magnetic field is formed so that the lines of magnetic force are substantially uniform in the plane of the substrate 81 during the etching, and the magnetic field is formed so that the lines of magnetic force converge in the vicinity of the central portion of the substrate 81 during the ashing. Therefore, it is possible to produce substantially uniform plasma in the plane of the substrate 81 during the etching to carry out uniform etching, and the density of plasma during the ashing can be greater than that during the etching, so that it is possible to shorten the ashing time.

Moreover, for example, when a polysilicon film is formed on the surface of a wafer on which a p-type or n-type silicon film has been formed, the present invention can be applied to a process for etching a natural oxide film, which has been formed on the surface of the wafer (the surface of the silicon film) to form the polysilicon film. In this case, a magnetic field is first formed so that the lines of magnetic force converge in the vicinity of the central portion, to etch the natural oxide film on the surface of the silicon film with, e.g., a CF containing gas, and then, a mirror magnetic field is formed so as to obtain a uniform density of plasma on the surface of the wafer to carry out a treatment. Also in this case, it is possible to carry out a pretreatment, which is the removal of the natural oxide film, in a short time.

Referring to FIGS. 7(a) through 9, another embodiment of the present invention will be described below. In this embodiment, the shape of a magnetic field is changed by changing the current values of the main electromagnetic coil 26 and the auxiliary electromagnetic coil 27. First, a first etching step is carried out in a mirror magnetic field as shown in FIG. 7(a), and then, a second etching step is carried out in a divergent magnetic field as shown in FIG. 7(b).

In an example of etching, an $SiO_2$ film 82 is formed on the top face of a substrate 81 of, e.g., a polysilicon, and a resist film 83 is formed on the top face of the $SiO_2$ film 82 to etch the $SiO_2$ film 82 with an etching gas, e.g., a compound gas of C (carbon) and F (fluorine) (which will be hereinafter referred to as a "CF containing gas"), such as $C_4F_8$ gas.

First, at the first etching step, as shown in FIG. 7(a), the current value of the auxiliary electromagnetic coil 27 is increased to increase the amount narrowed by the auxiliary electromagnetic coil 27. Thus, although the magnetic field B is expanded as it goes downward, it is narrowed as it further goes downwards, so that a mirror magnetic field is formed. In this magnetic field, etching is carried out. In the mirror magnetic field shown in FIG. 7(a), the anisotropy of etching is great to form high etching characteristics in a direction perpendicular to the face of the wafer W, so that a hole 85 is formed at a high aspect ratio by etching.

Then, when the hole 85 is formed so as to have a predetermined depth, the second etching step is carried out. At the second etching step, as shown in FIG. 7(b), the current value of the auxiliary electromagnetic coil 27 is set to be far lower than that of the main electromagnetic coil 26, so that the amount narrowed by the auxiliary electromagnetic coil 27 is very small. Thus, the magnetic field B is like a divergent magnetic field which is expanded as it goes downward. In this magnetic field, etching is further carried out. In the divergent magnetic field shown in FIG. 7(b), the isotropy of etching characteristics is enhanced. As a result, the etching action proceeds in the depth direction of the hole 85, and it is possible to form a tapered portion 85a which is expanded outward in the vicinity of the entrance of the hole 85.

Referring to FIGS. 8 and 9, effects obtained by forming the tapered portion 85a expanded outward in the vicinity of the entrance of the hole 85 will be described below.

FIG. 8 shows a step of forming a conductor wiring of Al in the hole 85. When the conductor wiring of Al is formed, Al is supplied into the hole 85 by sputtering, and the $SiO_2$ film 82 is heated at a temperature of 500° C. to 550° C. A part of Al supplied by sputtering adheres on the surface of the $SiO_2$ film 82 as a lump 87 of Al. Since the $SiO_2$ film 82 is heated at 500° C. to 550° C., the lump 87 of Al re-flows to flow into the hole 85. At this time, since the tapered portion 85a that is expanded outward in the vicinity of the entrance of the hole 85 is formed, the lump 87 of Al can efficiently re-flow into the hole 85 as shown by arrow 88.

Referring to FIG. 9, other effects obtained by forming the tapered portion 85a that is expanded outward in the vicinity of the entrance of the hole 85 will be described below.

FIG. 9 shows a step of forming a conductor wiring of Cu in the hole 85. The conductor wiring of Cu is formed by introducing a Cu plating solution 89 into the hole 85. In this case, since the tapered portion 85a expanded outward in the vicinity of the entrance of the hole 85 is formed, an introducing frontage for introducing the Cu plating solution 89 is expanded, so that it is possible to easily supply the Cu plating solution 89 into the hole 85. Thus, it is possible to form a conductor wiring between interlayer dielectric film, such as CF films, by Cu which has a lower resistance than that of Al.

In the plasma processing system for carrying out the method according to the present invention, a main electromagnetic coil 9 shown in, e.g., FIG. 10, may be used. This main electromagnetic coil 9 is divided into, e.g., three parts, so that the current values of electromagnetic coils 91 through 93 can be changed, respectively. In this example, a gas nozzle 94 passes through the wall portions of the first vacuum chamber 21 and the second vacuum chamber 22 to introduce a plasma producing gas into the first vacuum chamber 21. Other constructions are the same as those of the plasma processing system shown in FIG. 1.

By changing the magnetic field as described above, the profile of the magnetic field in a treatment space is changed to control the plasma processing of the substrate. Then, by changing the profile of the magnetic field in the treatment space, the treated results in the plane of the substrate can be controlled so that the magnetic field is converged on the center and diffused to the periphery.

In addition, the method according to the present invention can be applied to a case where an SiOF film or a CF film is formed in place of the $SiO_2$ film. In addition, when various kinds of films are stacked, the present invention can be applied to a combination of an SiOF film with an $SiO_2$ film. Moreover, in the etching of the Al layer 72, plasma may be produced without adding $NH_3$ gas, to carry out the post-treatment by the heat of the plasma. Also in this case, the current values of the main electromagnetic coil 26 and the auxiliary electromagnetic coil 27 are adjusted so as to increase the heat gain of plasma into the substrate.

Moreover, according to the present invention, the plasma producing method should not be limited to ECR, but the present invention may be applied to a case where plasma called ICP (Inductive Coupled Plasma) is produced by, e.g., a method for applying electric and magnetic fields to a process gas from a coil wound onto a dome-shaped container. In addition, the present invention may be applied to a case where a plasma called helicon wave plasma is produced by the interaction between a helicon wave of, e.g., 13.56 MHz, and a magnetic field applied by a magnetic coil, a case where a plasma called magnetron plasma is produced by applying a magnetic field so that the magnetic field is substantially parallel to two parallel cathodes, and a case where a plasma is produced by applying a high-frequency power between electrodes called parallel plates which face each other.

According to the present invention, it is possible to provide a method capable of carrying out a plasma processing suitable for each of two processes by changing the profile of a magnetic field.

What is claimed is:

1. A plasma processing method for supplying a microwave into a vacuum vessel by high-frequency producing means and for forming a magnetic field in said vacuum vessel by magnetic field forming means to produce a plasma in said vacuum vessel by electron cyclotron resonance between said microwave and said magnetic field to treat a substrate to be treated with the produced plasma, said method comprising:

a first step of introducing said substrate into said vacuum vessel and for producing a plasma to heat said substrate; and a second step of activating a thin-film deposition gas in said vacuum vessel as a plasma which forms a thin film on said substrate;

wherein the shape of said magnetic field is changed by setting current values of said magnetic field forming means at said first and second steps to be different from each other so that a magnetic flux density on said substrate during the production of said plasma at said first step is greater than that at said second step.

2. A plasma processing method for supplying a microwave into a vacuum vessel by high-frequency producing means and for forming a magnetic field in said vacuum vessel by magnetic field forming means to produce a plasma in said vacuum vessel by electron cyclotron resonance between said microwave and said magnetic field to treat a substrate to be treated with the produced plasma, said method comprising:

a first thin-film deposition step of activating a first thin-film deposition gas in said vacuum vessel as a plasma which forms a first film on said substrate; and a second thin-film deposition step of activating a second thin-film deposition gas in said vacuum vessel as a plasma which forms a second film on said first film;

wherein current values of said magnetic field forming means at said first and second thin-film deposition steps are set to be different from each other to change the shape of said magnetic field.

3. A plasma processing method for supplying a microwave into a vacuum vessel by high-frequency producing means and for forming a magnetic field in said vacuum vessel by magnetic field forming means to produce a plasma in said vacuum vessel by electron cyclotron resonance between said microwave and said magnetic field to treat a substrate to be treated with the produced plasma, said method comprising:

an etching step of activating an etching gas in said vacuum vessel as a plasma which etches said substrate; and a post-treatment step of activating a post-treating gas in said vacuum vessel as a plasma which carries out a post-treatment with respect to said substrate;

wherein the shape of said magnetic field is changed by setting current values of said magnetic field forming means at said etching and post-treatment steps to be different from each other so that a magnetic flux density on said substrate during the production of said plasma at said post-treatment step is greater than that at said etching step, thereby increasing a heat gain into said substrate due to said plasma.

4. A plasma processing method for supplying a microwave into a vacuum vessel by high-frequency producing means and for forming a magnetic field in said vacuum vessel by magnetic field forming means to produce a plasma in said vacuum vessel by electron cyclotron resonance between said microwave and said magnetic field to treat a substrate to be treated with the produced plasma, said method comprising:

an etching step of activating an etching gas in said vacuum vessel as a plasma which etches said substrate; and a post-treatment step of activating a post-treating gas in said vacuum vessel as a plasma which removes the residual of said etching gas in said substrate, said residual being formed at said etching step;

wherein the shape of said magnetic field is changed by setting current values of said magnetic field forming means at said etching and post-treatment steps to be different from each other so that a magnetic flux density on said substrate during the production of said plasma at said post-treatment step is greater than that at said etching step.

5. A plasma processing method for supplying a microwave into a vacuum vessel by high-frequency producing means and for forming a magnetic field in said vacuum vessel by magnetic field forming means to produce a plasma in said vacuum vessel by electron cyclotron resonance between said microwave and said magnetic field to treat a substrate to be treated with the produced plasma, said method comprising:

an etching step of activating an etching gas in said vacuum vessel as a plasma which etches said substrate, on which a resist film has been formed; and a post-treatment step of activating oxygen gas in said vacuum vessel as a plasma which ashes said resist film;

wherein the shape of said magnetic field is changed by setting current values of said magnetic field forming means at said etching and post-treatment steps to be different from each other so that a magnetic flux density on said substrate during the production of said plasma at said post-treatment step is greater than that at said etching step.

6. A plasma processing method for supplying a microwave into a vacuum vessel by high-frequency producing means and for forming a magnetic field in said vacuum vessel by magnetic field forming means to produce a plasma in said vacuum vessel by electron cyclotron resonance between said microwave and said magnetic field to treat a substrate to be treated with the produced plasma, said method comprising:

an etching step of activating an etching gas in said vacuum vessel as a plasma which etches a natural oxide film on the surface of said substrate; and a thin-film deposition step of activating a thin-film deposition gas in said vacuum vessel as a plasma which forms a thin film on the surface of said substrate;

wherein the shape of said magnetic field is changed by setting current values of said magnetic field forming means at said etching and thin-film deposition steps to be different from each other so that a magnetic flux density on said substrate during the production of said plasma at said etching step is greater than that at said thin-film deposition step.

7. A plasma processing method for supplying a microwave into a vacuum vessel by high-frequency producing means and for forming a magnetic field in said vacuum vessel by magnetic field forming means to produce a plasma in said vacuum vessel by electron cyclotron resonance between said microwave and said magnetic field to treat a substrate to be treated with the produced plasma, said method comprising:

a first etching step of activating an etching gas in said vacuum vessel as a plasma which etches said substrate; and a second etching step of further etching said substrate by said plasma after said first etching step;

wherein the shape of said magnetic field is changed by setting current values of said magnetic field forming means at said first and second etching steps to be different from each other so that an anisotropy of etching is high and an etching characteristic is high in a direction perpendicular to the surface of said substrate at said first etching step and so that the isotropy of etching with respect to the surface of said substrate at said second etching step is higher than that at said first etching step.

8. A plasma processing method as set forth in claim 7, wherein said shape of said magnetic field at said first etching step is the shape of a mirror magnetic field, and said shape of said magnetic field at said second etching step is the shape of a divergent magnetic field.

9. A plasma processing method as set forth in claim 4, wherein said etching gas including $Cl_2$ gas, and said post-treating gas includes $NH_3$ gas.

* * * * *